US006999184B2

(12) United States Patent
Yakiyama et al.

(10) Patent No.: US 6,999,184 B2
(45) Date of Patent: Feb. 14, 2006

(54) ELECTRONIC COMPONENT MOUNTING APPARATUS AND ELECTRONIC COMPONENT MOUNTING METHOD

(75) Inventors: Hideyuki Yakiyama, Chikushino (JP); Yasuhiro Emoto, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/972,046

(22) Filed: Oct. 22, 2004

(65) Prior Publication Data

US 2005/0088666 A1 Apr. 28, 2005

(30) Foreign Application Priority Data

Oct. 24, 2003 (JP) ............................. 2003-364273
Oct. 24, 2003 (JP) ............................. 2003-364274

(51) Int. Cl.
*G01B 11/14* (2006.01)
*G23P 19/00* (2006.01)
(52) U.S. Cl. .................. 356/614; 29/740; 414/416.03; 414/331.18
(58) Field of Classification Search .. 356/237.1–237.6, 356/614; 414/225, 416, 752–753, 416.03, 414/331.18; 29/739–740, 743, 759
See application file for complete search history.

(56) References Cited

U.S. PATENT DOCUMENTS

| | | | | |
|---|---|---|---|---|
| 3,766,046 A | * | 10/1973 | Flint | 204/297.08 |
| 4,558,835 A | * | 12/1985 | Sunaoka | 242/437.2 |
| 4,818,169 A | * | 4/1989 | Schram et al. | 414/331.18 |
| 5,839,187 A | | 11/1998 | Sato et al. | |
| 6,053,688 A | * | 4/2000 | Cheng | 414/416.03 |
| 6,249,342 B1 | * | 6/2001 | Cheng | 356/237.2 |
| 6,874,225 B1 | * | 4/2005 | Haji et al. | 29/740 |

FOREIGN PATENT DOCUMENTS

| | | |
|---|---|---|
| JP | 10-270532 | 10/1998 |
| JP | 3132353 | 11/2000 |
| JP | 2001-267335 | 9/2001 |
| JP | 2001-320195 | 11/2001 |
| JP | 2003-273167 | 9/2003 |
| WO | WO 03/015489 A2 | 2/2003 |

* cited by examiner

*Primary Examiner*—Gregory J. Toatley, Jr.
*Assistant Examiner*—Sang H. Nguyen
(74) *Attorney, Agent, or Firm*—Pearne & Gordon LLP

(57) ABSTRACT

Jig interchanging mechanism for supplying and carrying out a component holding jig to and from an electronic component supply portion is moved by a component image taking camera moving mechanism for moving the component image taking camera above the electronic component supply portion, the compact electronic component mounting apparatus and the electronic component mounting method excellent in an operational efficiency can be realized.

12 Claims, 10 Drawing Sheets

ELECTRONIC COMPONENT MOUNTING APPARATUS AND ELECTRONIC COMPONENT MOUNTING METHOD

BACKGROUND OF THE INVENTION

The present invention relates to an electronic component mounting apparatus and an electronic component mounting method for mounting an electronic component on a circuit board.

In a background art, an electronic component supplied in a state of a semiconductor wafer such as a semiconductor chip or the like is mounted onto a circuit board of lead frame or the like by an electronic component mounting apparatus having an exclusive supply apparatus. An adhering sheet pasted with the semiconductor wafer is mounted to the supply apparatus in a state of being held by a wafer ring and when all of semiconductor chips are taken out from a single wafer ring, the empty wafer ring is interchanged by a new wafer ring by an interchanging apparatus having a grabbing and carrying function. For example, it is proposed in Japanese Patent Publication JP-A-10-270532 or U.S. Pat. No. 5,839,187.

Further, when the semiconductor chip is taken out from the adhering sheet, it is necessary to suck to hold the semiconductor chip accurately with high positional accuracy and therefore, according to an electronic component supply portion mounted with the wafer ring, a constitution is known having a component image taking camera movable on the electronic component supply portion for recognizing a position of the semiconductor chip on the adhering sheet. For example, it is proposed in JP-A-2001-267335.

However, according to the electronic component mounting apparatus of the background art, the interchanging apparatus provided separately is constituted to attach to the electronic component mounting apparatus and therefore, along with a problem in view of arranging a facility in which large-sized formation of a total of the facility is unavoidable, a time lag in operation is unavoidable for avoiding interference between operation of recognizing a component by a component recognizing camera and operation of interchanging the wafer ring and there is a case in which it is difficult to promote an operational efficiency.

Meanwhile, in recent years, a size of a semiconductor wafer becomes large-sized and a semiconductor wafer of twelve (12) inches is used. Therefore, a size and a weight of a magazine containing a number of sheets of semiconductor wafers are increased, manual handling of the background art becomes difficult and therefore, there is adopted a method of mounting a magazine to an electronic component mounting apparatus by exclusive handling means of a carriage or the like.

However, according to the background art described in JP-A-10-270532 or U.S. Pat. No. 5,839,187, when a mechanism of carrying in and carrying out a wafer ring to interchange is attached to the electronic component mounting apparatus, it is difficult to compactly realize a constitution suitable for access by the above-described exclusive handling means to pose a problem that the size of the total of the apparatus is increased.

SUMMARY OF THE INVENTION

Hence, it is an object of the invention to provide a compact electronic component mounting apparatus and an electronic component mounting method excellent in an operational efficiency. Particularly, it is provided an electronic component mounting apparatus and an electronic component mounting method capable of realizing a mechanism of interchanging a component holding jig of a wafer ring or the like by a compact constitution.

According to the present invention, an electronic component mounting apparatus includes: an electronic component supply portion for supplying a plurality of pieces of electronic components aligned in a planer shape to be held by a component holding jig; a board holding portion arranged at a position remote from the electronic component supply portion in a first direction; a mounting head for holding the electronic component picked up from the electronic component supply portion and mounting the held electronic component on a board held by the board holding portion; a mounting head moving mechanism for moving the mounting head between the electronic component supply portion and the board holding portion; a component image taking camera for taking an image of the electronic component of the electronic component supply portion; a component recognition processing portion for acquiring a position of the electronic component of the electronic component supply portion by processing the image taken by the component image taken camera; a moving member for holding the component image taking camera and moving above the electronic component supply portion in the first direction driven by a component image taking camera moving mechanism; and a jig interchanging mechanism mounted to the moving member for interchanging the component holding jig of the electronic component supply portion by grabbing the component holding jig and moving in the first direction.

By constructing the constitution of moving the jig interchanging mechanism for supplying and carrying out the component holding jig to and from the electronic component supply portion by the component image taking camera moving mechanism for moving the component image taking camera above the electronic component supply portion, the compact electronic component mounting apparatus and the electronic component mounting method excellent in an operational efficiency can be realized.

According to the invention, an electronic component mounting apparatus includes: an electronic component supply portion for supplying a plurality of pieces of electronic components aligned in a planar shape to be held by a component holding jig; a board holding portion arranged at a position remote from the electronic component supply portion in a first direction; a component mounting means for holding the electronic component picked up from the electronic component supply portion and mounting the held electronic component on a board held by the board holding portion; a moving member mounted with an operating head for moving in the first direction driven by an operating head moving mechanism; and a jig interchanging mechanism mounted to the moving member for interchanging the component holding jig of the electronic component supply portion by grabbing the component holding jig and moving in the first direction; wherein the jig interchanging mechanism includes a jig grabbing portion mounted to the moving means movably in the first direction for grabbing the component holding jig, and a forward and rearward moving means for moving the jig grabbing portion forward and rearward in the first direction relative to the moving member.

By providing the jig grabbing portion mounted to the moving beam horizontally movably in the first direction for grabbing the component holding jig and the forward and rearward moving means for moving the jig grabbing portion forward and rearward in the first direction relative to the moving beam at the jig interchanging mechanism for supplying and carrying out the component holding jig to and from the electronic component supply portion, a stroke of moving the jig grabbing portion can be ensured without increasing the stroke of moving the moving beam in the first direction and the mechanism for interchanging the component holding jig can be realized by the compact constitution.

Figure 1:
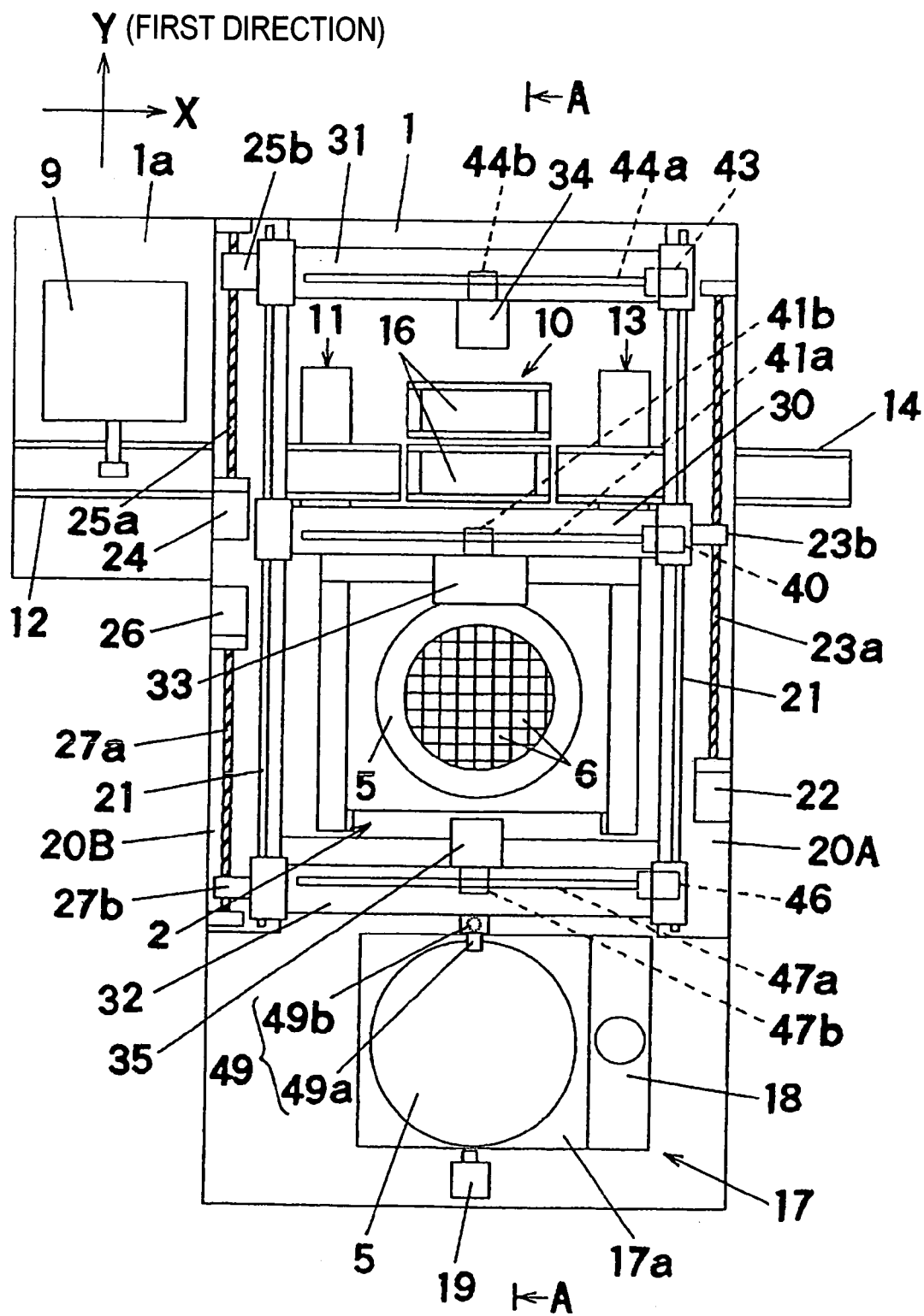
FIG. 1 is a plane view of an electronic component mounting apparatus according to an embodiment of the invention.

DETAILED DESCRIPTION OF THE PREFERRED EMBODIMENTS (Embodiment 1)

An embodiment of the invention will be explained with reference to the drawing as follows.

Figure 2:
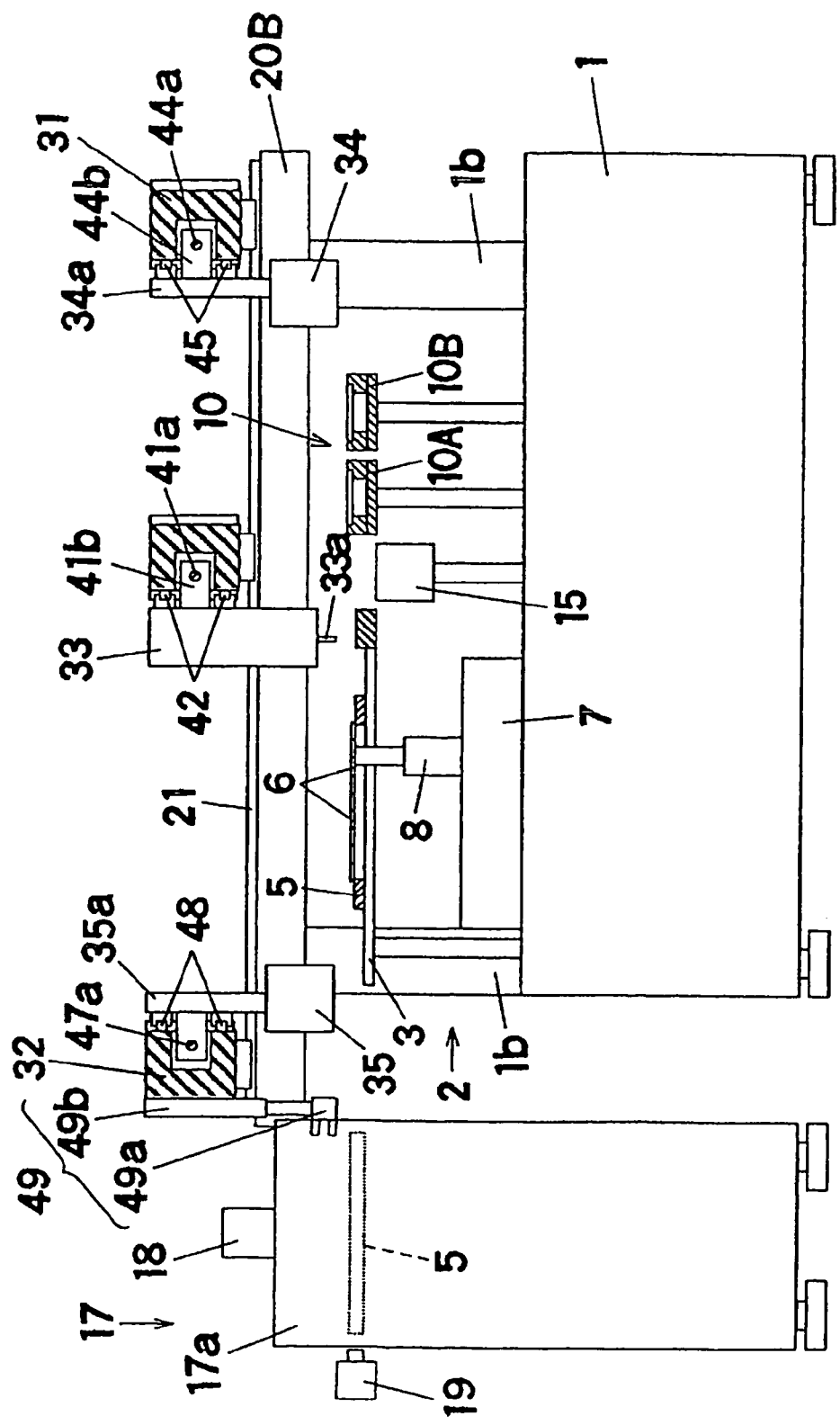
FIG. 2 is a side sectional view of the electronic component mounting apparatus according to the embodiment of the invention.

An explanation will be given of a total structure of an electronic component mounting apparatus with reference to FIG. 1 and FIG. 2. FIG. 2 shows a section taken along a line A—A of FIG. 1. In FIG. 1, an electronic component supply portion 2 is arranged on a base 1. As shown by FIG. 2, the electronic component supply portion 2 is provided with a wafer holding table 3, and the wafer holding table 3 detachably holds a wafer ring 5 which is a component holding jig. A sheet (illustration thereof is omitted) expanded to the wafer ring 5 is pasted with semiconductor chips 6 (hereinafter, abbreviated simply as "chip 6") which are electronic components in a state of being separated to individual pieces thereof and in a state of holding the wafer ring 5 at the wafer holding table 3, the electronic component supply portion 2 supplies the chips 6 held by being aligned by a plurality of pieces thereof in a planer shape to a component holding jig.

As shown by FIG. 2, on a lower side of the wafer ring 5 held by the wafer holding table 3, an ejector 8 is arranged horizontally movably by an ejector XY table 7. The ejector 8 is provided with a pin lifting mechanism for lifting an ejector pin (not illustrated) for pushing up the chip, and when the chip 6 is picked up from the wafer ring 5 by a mounting head, mentioned later, by pushing up the chip 6 from the lower side of the wafer ring 5 by the ejector pin, the chip 6 is exfoliated from the sheet expanded to the wafer ring 5. The ejector 8 constitutes a sheet exfoliating mechanism for exfoliating the chip 6 from the sheet expanded to the wafer ring 5.

Further, the sheet exfoliating mechanism is not limited to the ejector 8, shown here but a mechanism capable of exfoliating the chip from the sheet will do. For example, there may be constructed a mechanism of sucking the sheet pasted with the chip from the lower side and exfoliating the chip from the sheet by a suction force.

As shown by FIG. 1, a board holding portion 10 is arranged at a position remote from the electronic component supply portion 2 at an upper face of the base 1 in Y direction (first direction). On an upstream side and a downstream side of the board holding portion 10 are respectively aligned with a board carrying in conveyor 12, a board distributing portion 11, the board holding portion 10, a board delivery portion 13 and a board carrying out conveyor 14 in series in X direction. The board carrying in conveyor 12 is arranged to ride over a subbase 1a connected to the board 1 and an adhesive pasting apparatus 9 is arranged on the subbase 1a. The adhesive pasting apparatus 9 pastes an adhesive for adhering the chip to a board 16 carried in from the upstream side to the board carrying in conveyor 12 by a pasting head 9a.

The board 16 after having been pasted with the adhesive is delivered to the board distributing portion 11. The board distributing portion 11 distributes the board 16 received from the board carrying in conveyor 12 selectively to two board holding mechanisms of the board holding portion 10 explained below. The board holding portion 10 is provided with a first board holding mechanism 10A and a second board holding mechanism 10B to hold the board 16 distributed by the board distributing portion 11 to position to a mounting position. The board delivery portion 13 selectively receives the mounted board 16 from the first board holding mechanism 10A, the second board holding mechanism 10B to deliver to the board carrying out conveyor 14. The board carrying out conveyor 14 carries out the delivered mounted board 16 to the downstream side.

A wafer supply portion 17 is arranged at a position remote from the electronic component supply portion 2 on an upper face of the base 1 on a side opposed to the board holding portion 10 in Y direction (first direction). The wafer supply portion 17 is provided with a magazine holding portion 17a and a lifter mechanism 18 for lifting the magazine at inside of the magazine holding portion 17a for holding and lifting the magazine contained with the wafer rings 5 in a laminated state.

By lifting the magazine by the lifter mechanism 18, as shown by FIG. 2, the wafer ring 5 can be disposed at a carrying level for interchanging the wafer ring 5 between the wafer supply portion 17 and the electronic component supply portion 2. The wafer ring 5 disposed at the carrying level is pushed in a right direction by a pushing mechanism 19, grabbed by a chuck portion 49a of a jig interchanging mechanism 49, mentioned later, and carried to the electronic component supply portion 2. Further, the vacant wafer ring 5 after all the chips 6 have been taken out at the electronic component supply portion 2 is carried out from the electronic component supply portion 2 to the wafer supply portion 17 by the jig interchanging mechanism 49 and is recovered into the magazine.

In FIG. 1, both end portions of the upper face of the base 1 are arranged with a first Y axis base 20A and a second Y axis base 20B by directing longitudinal directions thereof to Y direction (first direction) orthogonal to the board carrying direction (X direction). Upper faces of the first Y axis base 20A and the second Y axis base 20B are arranged with first direction guides 21 substantially over entire lengths thereof in the longitudinal directions (Y direction) to constitute a mode of arranging the pair of first direction guides 21 in parallel with each other and to interpose the electronic component supply portion 2 and the board holding portion 10.

The pair of first direction guides 21 are hung slidably with three beam members of a first beam member 31, a center beam member 30 and a second beam member 32 of a both ends supporting type both end portions of which are supported by the first direction guides 21 respectively in Y direction, a nut member 23b is projected from a side end portion of the right side of the center beam member 30, and a feed screw 23a screwed to the nut member 23b is driven to rotate by a Y axis motor 22 arranged on the first Y axis base 20A in a horizontal direction. By driving the Y axis motor 22, the center beam 30 is moved along the first direction guide 21 horizontally in Y direction.

Further, side end portions on the left side of the first beam member 31 and the second beam member 32 are respectively projected with nut members 25b, 27b and feed screws 25a, 27a screwed to the nut members 25b, 27b are driven to rotate by Y axis motors 24, 26 respectively arranged on the second Y axis base 20B in the horizontal direction. By driving the Y axis motors 24, 26, the first beam member 31 and the second beam member 32 are moved along the first direction guide 21 horizontally in Y direction.

The center beam member 30 is mounted with a mounting head 33, and a feed screw 41a screwed to a nut member 41b coupled to the mounting head 33 is driven to rotate by an X axis motor 40. By driving the X axis motor 40, the mounting head 30 is moved in X direction (second direction) by being guided by a second direction guide 42 (refer to FIG. 2) provided at a side face of the center beam member 30 in X direction (second direction).

The mounting head 33 is provided with a plurality (4 in this case) of nozzles 33a each holding a single piece of the chip 6 and is made to be movable in a state of holding the plurality of chips 6 by sucking the respective chips 6 to the respective nozzles 33a. By driving the Y axis motor 22 and the X axis motor 40, the mounting head 33 is horizontally moved in X direction and Y direction, picks up to hold the chip 6 of the electronic component supply portion 2 and mounts the held chip 6 to an electronic component mounting position 16a of the board 16 held by the board holding portion 10.

Further, a mechanism for picking up the chip may separately be provided and the mounting head may receive to hold the chip from the pick up mechanism. Further, when the pick up mechanism is provide with a chip reversing mechanism, the chip reversing mechanism can deal with flip chip mounting of mounting the chip of the board by reversing head and tail thereof, which is preferable.

The pair of first direction guides 21, the center beam member 30, and a first direction drive mechanism (Y axis motor 22, feed screw 23a and nut member 23b) for moving the center beam member 30 along the first direction guides 21, and a second direction drive mechanism (X axis motor 40, feed screw 41a and nut member 41b) for moving the mounting head 33 along the second direction guide 42 constitute a mounting head moving mechanism for moving the mounting head 33 between the electronic component supply portion 2 and the board holding portion 10.

The first beam member 31 is mounted with a first camera 34, and a bracket 34a holding the first camera 34 is coupled with a nut member 44b. A feed screw 44a screwed to the nut member 44b is driven to rotate by an X axis motor 43, and by driving the X axis motor 43, the first camera 34 is moved in X direction by being guided by a second direction guide 45 (refer to FIG. 2) provided at a side face of the first beam member 31.

By driving the Y axis motor 24 and the X axis motor 43, the first camera 34 is horizontally moved in X direction and in Y direction. Thereby, the first camera 34 can be moved above the board holding portion 10 for taking an image of the board 16 held by the first board holding mechanism 10A, the second board holding mechanism 10B and can be moved for escaping from a position above the board holding portion 10.

The pair of first direction guides 21, the first beam member 30, a first direction driving mechanism (Y axis motor 24, feed screw 25a and nut member 25b) for moving the first beam member 31 along the first direction guide 21, and a second direction drive mechanism (X axis motor 43, feed screw 44a and nut member 44b) constitute a first camera moving mechanism for moving the first camera 34 above the board holding portion 10.

The second beam member 32 (moving beam) is mounted with a second camera 35, and a bracket 35a holding the second camera 35 is coupled with a nut member 47b. A feed screw 47a screwed to the nut member 47b is driven to rotate by an X axis motor 46, and by driving the X axis motor 46, the second camera 35 is moved in X direction by being guided by a second direction guide 48 (refer to FIG. 2) provided at a side face of the second member 32.

By driving the Y axis motor 26 and the X axis motor 46, the second camera 35 is horizontally moved in X direction and in Y direction. Thereby, the second camera 35 can be moved above the electronic component supply portion 2 for taking an image of the chip 6 held by the electronic component supply portion 2 and can be moved for escaping from a position above the electronic component supply portion 2.

The pair of first direction guides 21, the second beam member 32, a first direction drive mechanism (Y axis motor 26, feed screw 27a and nut member 27b) and a second direction drive mechanism (X axis motor 36, feed screw 47a and nut member 47b) for moving the second camera 35 along the second guide 48 constitute a component image taking camera moving mechanism for moving the second camera 35 which is a component image taking camera. Therefore, the second beam member 32 is moved in the first direction above the electronic component supply portion 2 by the component image taking camera moving mechanism.

The jig interchanging mechanism 49 is mounted on a side opposed to a side face of the second beam member 32 mounted with the second camera 35. The jig interchanging mechanism 49 is constituted by the chuck portion (jig grabbing portion) 49a having a chuck claw for pinching an end portion of the wafer ring 5 on one side to grab, and a chuck portion lifting mechanism 49b for lifting the chuck portion 49a. The chuck claw is driven to open and close by a chuck claw opening/closing mechanism 49c (refer to FIG. 3).

By moving the jig interchanging mechanism 49 to the end portion of the wafer ring 5 by driving the second beam member 32, the wafer ring 5 can be grabbed by the chuck mechanism 49a, and by driving the second beam member 32 under the state, the wafer ring 5 can be grabbed and moved in Y direction by the jig interchanging mechanism 49. Thereby, in a procedure of repeatedly executing electronic component mounting operation, there can be executed wafer ring interchanging operation for changing the wafer ring 5 of the electronic component supply portion 2 emptied by taking out the chip 6 by a new one of the wafer ring 5 contained in the wafer supply portion 17.

As shown by FIG. 2, a third camera 15 is arranged between the electronic component supply portion 2 and the board holding portion 10. By moving the mounting head 3 which has picked up the chip 6 at the electronic component supply portion 2 above the third camera 15 in X direction, the third camera 15 takes an image of the chip 6 held by the mounting head 33.

Figure 3:
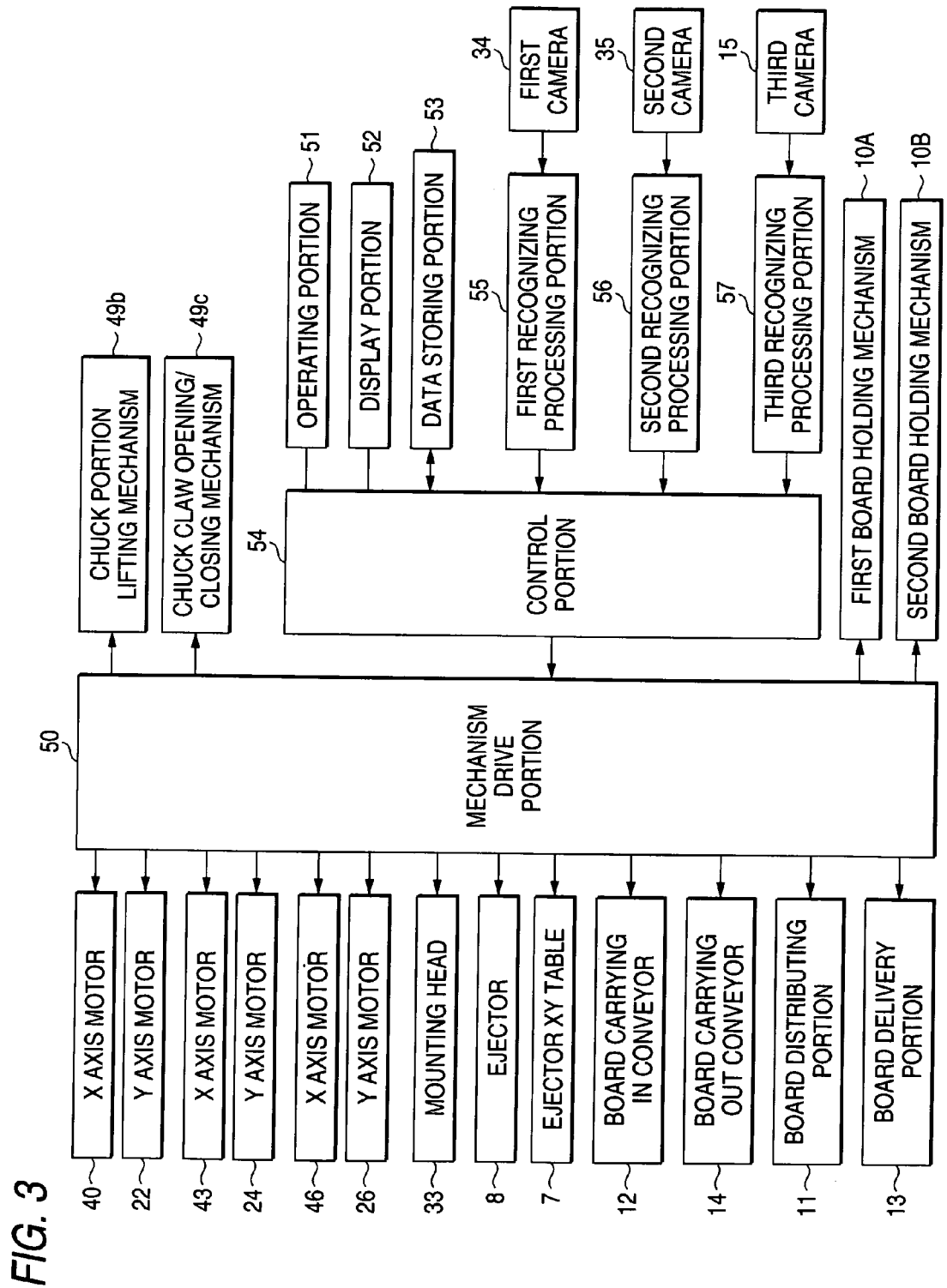
FIG. 3 is a block diagram showing a constitution of a control system.

Next, an explanation will be given of a constitution of a control system of the electronic component mounting apparatus in reference to FIG. 3. In FIG. 4, a mechanism drive portion 50 comprises motor drivers for electrically driving motors of the respective mechanisms and control apparatus for controlling air pressure supplied to air cylinders of the respective mechanisms shown below and by controlling the mechanism drive portion 50 by a control portion 54, the following respective drive elements are driven.

The X axis motor 40 and the Y axis motor 22 drive the mounting head moving mechanism for moving the mounting head 33. the X axis motor 43 and the Y axis motor 24 drive the first camera moving mechanism for moving the first camera and the X axis motor 46 and the Y axis motor 26 drive the second camera moving mechanism for moving the second camera, respectively.

Further, the mechanism drive portion 50 drives a lifting mechanism of the mounting head 33 and a component sucking mechanism by the nozzle 33a (refer to FIG. 2) and drives drive motors of the lifting cylinder of the ejector 8 and the ejector XY table 7. Further, the mechanism drive portion 50 drives the board carrying in conveyor 12, the board carrying out conveyor 14, the board distributing portion 11, the board delivery portion 13, the first board holding mechanism 10A, the second board holding mechanism 10B, the chuck portion lifting mechanism 49b and the chuck claw opening/closing mechanism 49c of the jig interchanging mechanism 49.

A first recognition processing portion 55 calculates a position of the electronic component mounting position 16a (refer to FIG. 4) of the board 16 held by the board holding portion 10 by processing an image taken by the first camera 34. The electronic component mounting portion 16a indicates a position of the board 16 for mounting the chip 6 and the position can be detected by recognizing the image. A second recognition processing portion 56 as a component recognition processing portion calculates a position of the chip 6 of the electronic component supply portion 2 by processing an image taken by the second camera 35. A third recognition processing portion 57 calculates a position of the chip 6 held by the mounting head 33 by processing an image taken by the third camera 15.

Results of recognition by the first recognition processing portion 55, the second recognition processing portion 56 and the third recognition processing portion 57 are transmitted to the control portion 55. A data storing portion 53 stores various data of mounting data, component data or the like. An operating portion 51 is an input apparatus of a keyboard, a mouse or the like to input data or input to control command. A display portion 52 displays a screen of an image taken by the first camera 34, the second camera 35 or the third camera 15 and displays a guide screen in inputting by the operating portion 51.

The electronic component mounting apparatus is constituted as described above and an explanation will be given of an electronic component mounting method in reference to FIG. 4, FIG. 5, FIG. 6 as follows. In FIG. 4, a number of the chips 6 are pasted to the wafer ring 5 held by the wafer holding table 3 of the electronic component supply portion 2. Further, in the board holding portion 10, the boards 16 are respectively positioned to the first board holding mechanism 10A and the second board holding mechanism 10B. In mounting the electronic component shown here, a plurality (4 pieces in this case) of the chips 6 are successively sucked to be held by 4 of the suction nozzles 33a provided to the mounting head 33 and 4 pieces of the chips 6 are successively mounted to a plurality of the electronic component mounting positions 16a in one mounting turn.

Figure 4A:
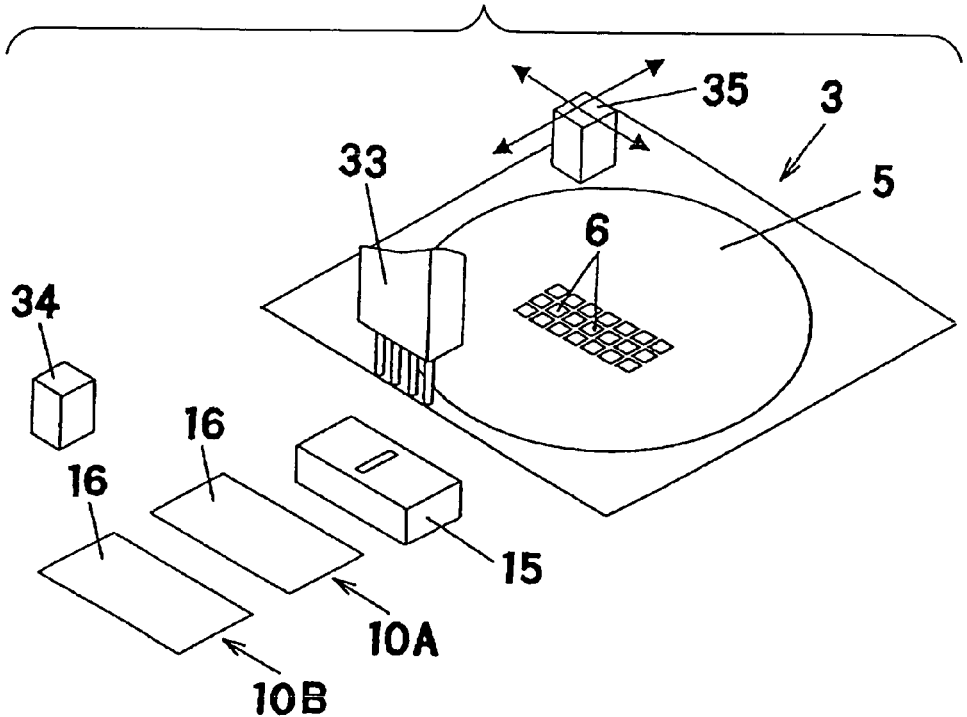
FIGS. 4A, 4B, 5A, 5B, 6A and 6B are explanatory views of steps of an electronic component mounting method according to the embodiment of the invention.
Figure 4B:
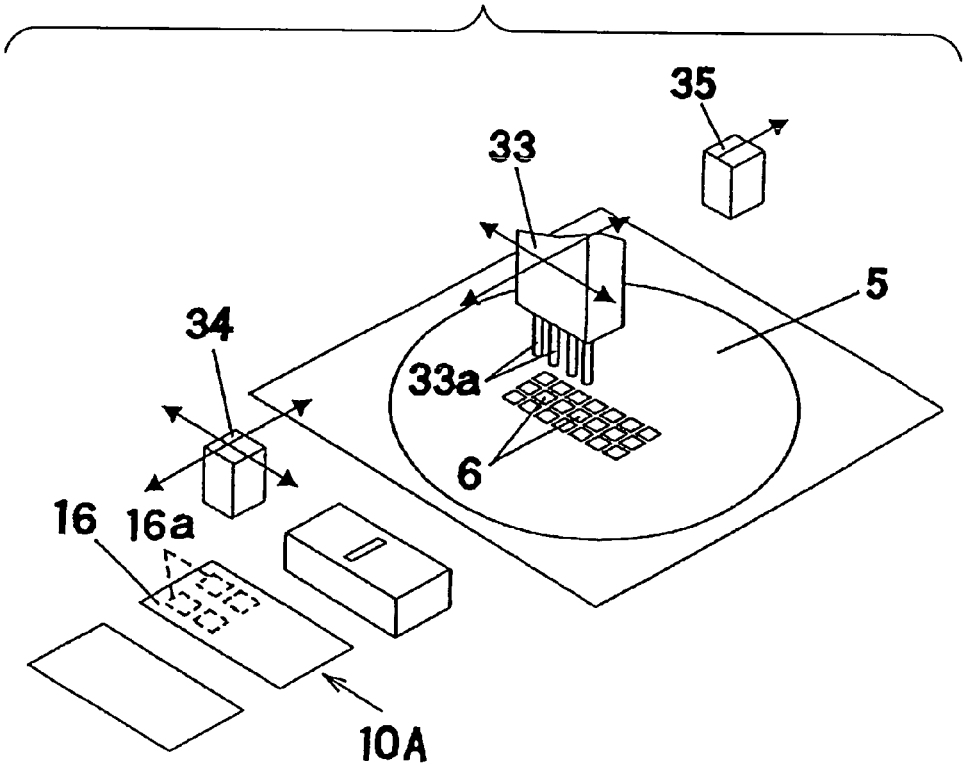

First, as shown by FIG. 4A, the second camera 35 is moved to above the electronic component supply portion 2 by the second camera moving mechanism to take an image of the plurality (4 pieces) of chips 6 intended to pick up by the second camera 35. Thereafter, as shown by FIG. 4B, the second camera 35 is escaped from a position above the chips 6 (camera escaping step). Further, positions of the plurality of chips 6 are calculated by processing to recognize the image taken by the second camera 35 by the second recognition processing portion 56 (component recognizing step).

Next, the mounting head 33 is moved to above the electronic component supply portion 2. Further, the plurality of chips 6 are successively picked up to take out by 4 of the suction nozzles 33a of the mounting head 33 while making the mounting head moving mechanism execute positioning operation for successively positioning the mounting head 33 to the chip 6 based on the calculated positions of the plurality of chips 6 (component taking out step).

In parallel with the picking up portion, the first camera 34 is moved to above the board 16 held by the first board holding mechanism 10A of the board holding portion 10 by the first camera moving mechanism. Further, the first camera 34 is successively moved to 4 of the electronic component mounting positions 16a on the left side in the electronic component mounting positions set at the board 16 as an object of inputting an image and takes an image of the plurality of electronic component mounting position 16a to input the image and thereafter, the first camera 34 is escaped from a position above the board 16.

Figure 5A:
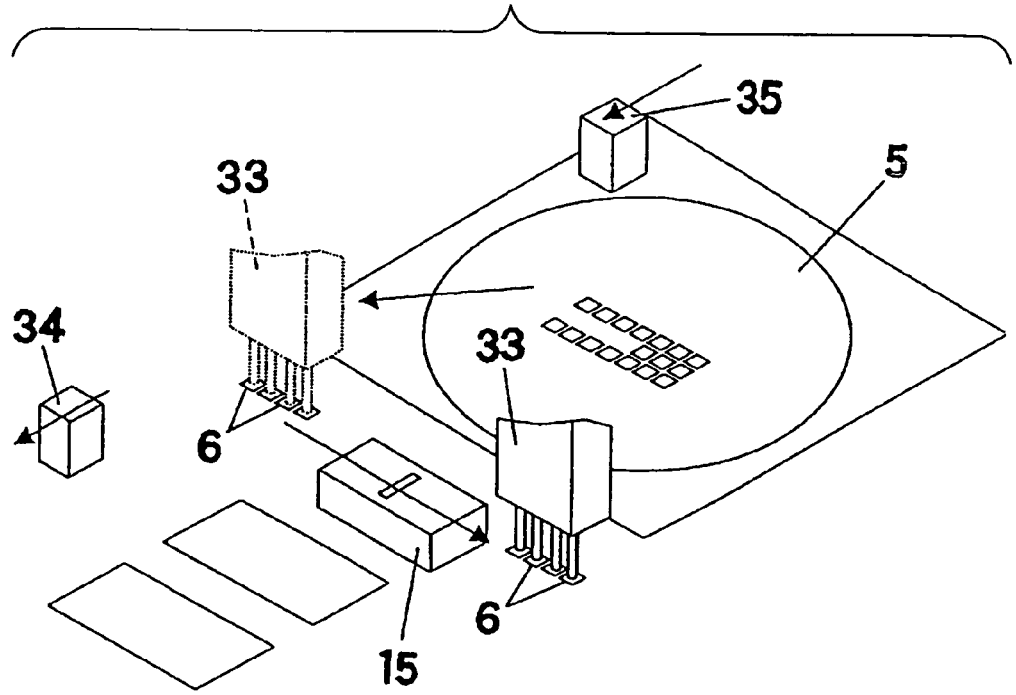

Further, the image taken by the first camera 34 is processed by the first recognition processing portion 55 to calculate the position of the electronic component mounting position 16a of the board 16. Next, as shown by FIG. 5A, the mounting head 33 holding 4 of the chips at the respective suction nozzles 33a execute scanning operation of moving above the third camera 15. Thereby, the image of the chips 6 held by the respective suction nozzles 33a are input to the third camera and by processing to recognize the image by the third recognition processing portion 57, the positions of the chips 6 are detected.

Figure 5B:
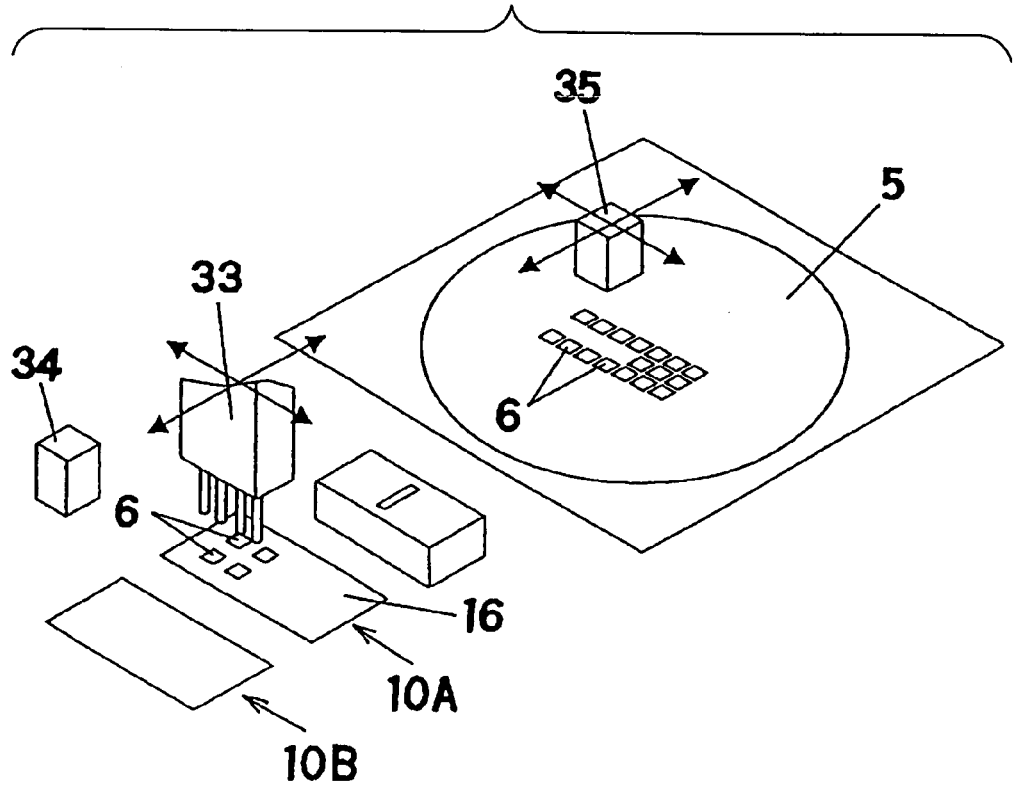

Next, the operation shifts to mounting operation. As shown by FIG. 5B, the mounting head 33 is moved to the position above the board holding portion 10. Further, the control portion 54 carries out mounting operation of successively mounting the chip 6 held by the mounting head 33 onto the board 16 held by the board holding portion 10 while moving the mounting head 33 by the mounting head moving mechanism based on the position of the electronic component mounting position 16a calculated by the first recognition processing portion 55 and the position of the chip 6 calculated by the third recognition processing portion 57 at this occasion (component mounting step).

Further, in mounting the chip 6 by the mounting head 33, the second camera 35 is moved to above the plurality of chips 6 to be picked up successively at the electronic component supply portion 2 to take an image of the plurality of chips 6 by the second camera 35 (camera approching step). Further, thereafter, respective steps similar to the above-described are repeatedly executed and in a procedure of executing the respective steps, operation of interchanging the wafer ring 5 held by the electronic component supply portion 2 is executed.

Figure 6A:
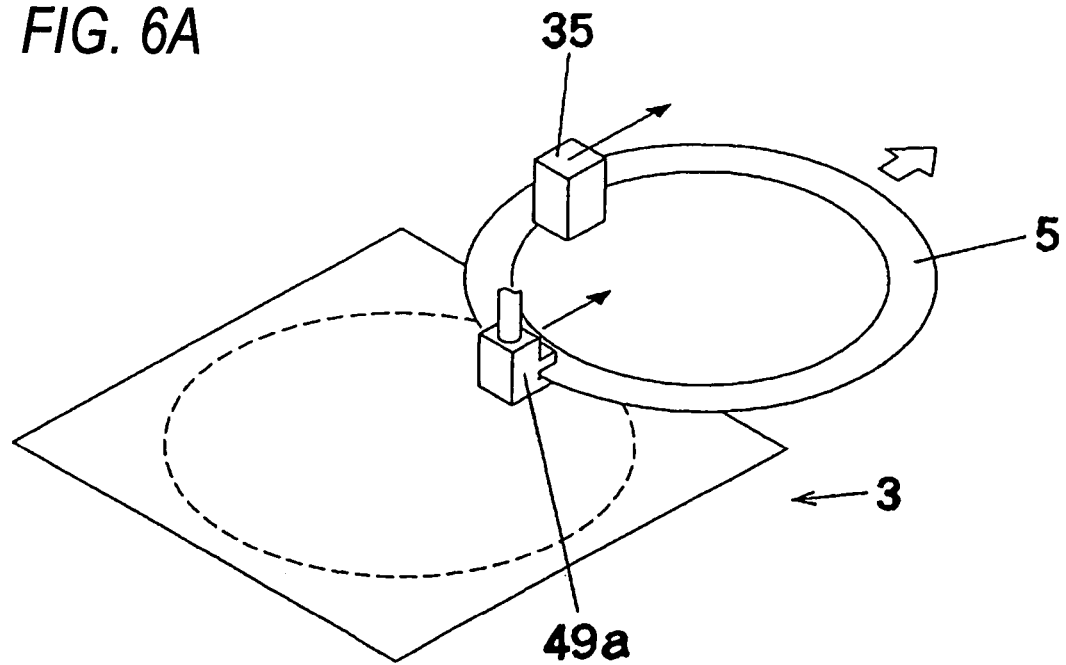

That is, when all of the chips 6 of the wafer ring 5 are taken out, in a camera escaping step at a successive time, as shown by FIG. 6A, the empty wafer ring 5 is grabbed by the chuck portion 49*a* of the jig interchanging mechanism 49. Further, by driving the second beam member 32, the jig interchanging mechanism 49 is moved along with the second camera 35 and the wafer ring 5 is carried out to the wafer supply portion 17 (FIG. 1, FIG. 2).

Figure 6B:
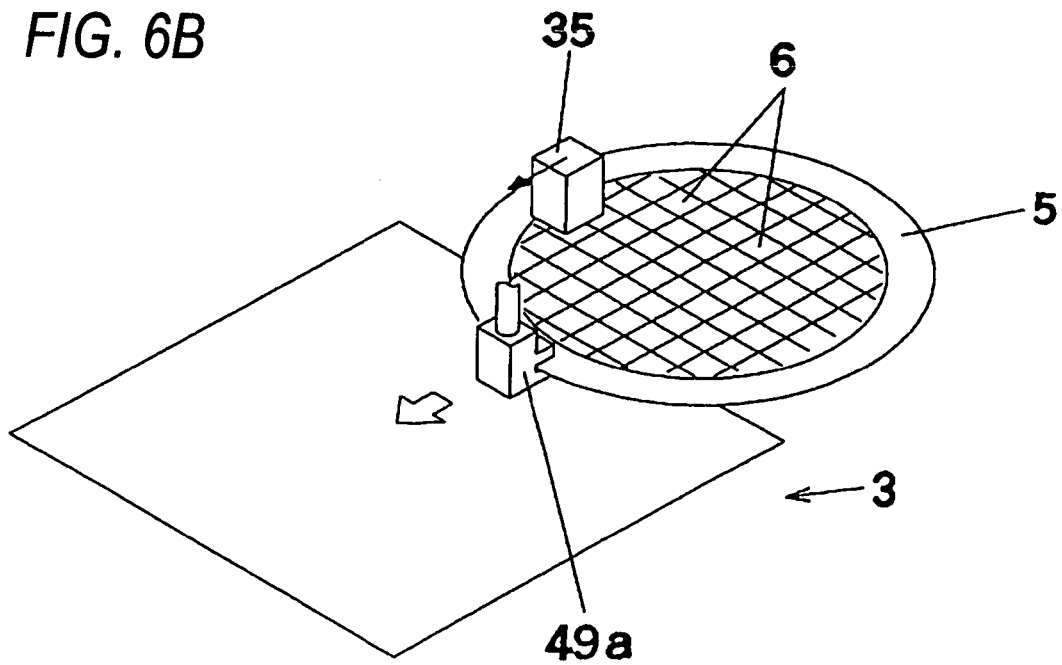

Further, at the wafer supply portion 17, the empty wafer ring 5 is contained in the magazine and successively, a new one of the wafer ring 5 is grabbed by the jig interchanging mechanism 49. Thereafter, by driving the second beam member 32, as shown by FIG. 6B, the jig interchanging mechanism 49 is moved to the electronic component supply portion 2 along with the second camera 35 and the wafer holing table 3 is made to hold the wafer ring 5.

That is, in a procedure of repeatedly executing the camera escaping step, the wafer ring 5 is carried out from the electronic component supply portion 2 by the jig interchanging mechanism 49 and in a procedure of repeatedly executing the camera approaching step, the wafer ring 5 is carried in to the electronic component supply portion 2 by the jig interchanging mechanism 49.

As has been explained above, the electronic component mounting apparatus shown in the embodiment is constituted to move the jig interchanging mechanism 49 for supplying the wafer ring 5 to the electronic component supply portion 2 to carry out to interchange by the component image taking camera moving mechanism of moving the second camera 35 which is the component image taking camera above the electronic component supply portion 2.

Thereby, in comparison with the apparatus of the background art separately providing the jig interchanging apparatus for operating to interchange the wafer between the electronic component supply portion 2 and the wafer supply portion 17, the space saving compact electronic component mounting apparatus is realized. Further, the jig interchanging mechanism 49 is constituted to move by the second beam member 32 supported by the both sides and therefore, a state of operating the jig interchanging mechanism 49 in a state of grabbing and carrying the wafer ring 5 is stabilized. Therefore, a drawback by an unstable attitude of the wafer ring brought about in the apparatus of the background art for supporting the wafer ring by the one side to carry is not brought about, and even in the case of constituting the object by a large-sized wafer, stable wafer interchanging operation is realized.

Further, there is constructed a constitution of integrally moving the second camera 35 and the jig interchanging mechanism 49 and therefore, there is not brought about operational interference between image taking operation of the second camera 35 for taking the image of the chip 6 at the electronic component supply portion 2 and operation of interchanging the wafer ring 5 by the jig interchanging mechanism 49. That is, it is not necessary to take operational time lag for avoiding interference between component recognizing operation by the component recognizing camera and operation of interchanging the wafer ring which has been needed in the apparatus of the background art for separately providing the jig interchanging apparatus into consideration and the operational efficiency can be promoted.

Further, although according to the embodiment, the wafer ring holding the semiconductor chip in the state of wafer is constituted to be the component holding jig for aligning the plurality of pieces of electronic components in a planer shape, the mode of the component holding jig is not limited to the wafer ring expanded with the wafer sheet but so far as the component holding jig arranges the electronic component in a planer shape to contain such as a tray of aligning to mount the electronic components, the component holding jig constitutes an object to which the invention is applied.

(Embodiment 2)

Next, another embodiment of the invention will be explained in reference to the drawing.

Figure 7:
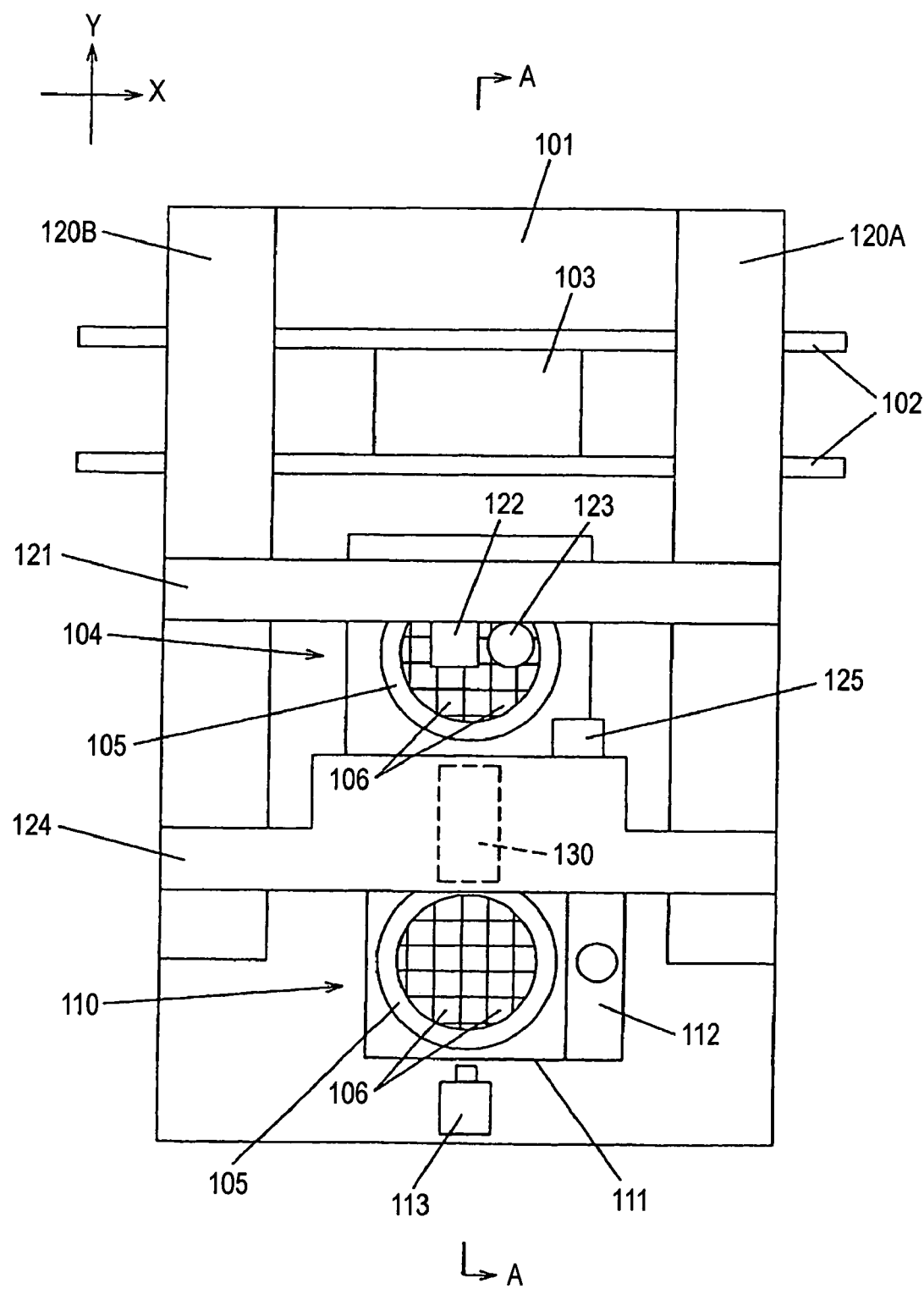
FIG. 7 is a plane view of an electronic component mounting apparatus according to other embodiment of the invention.
Figure 8:
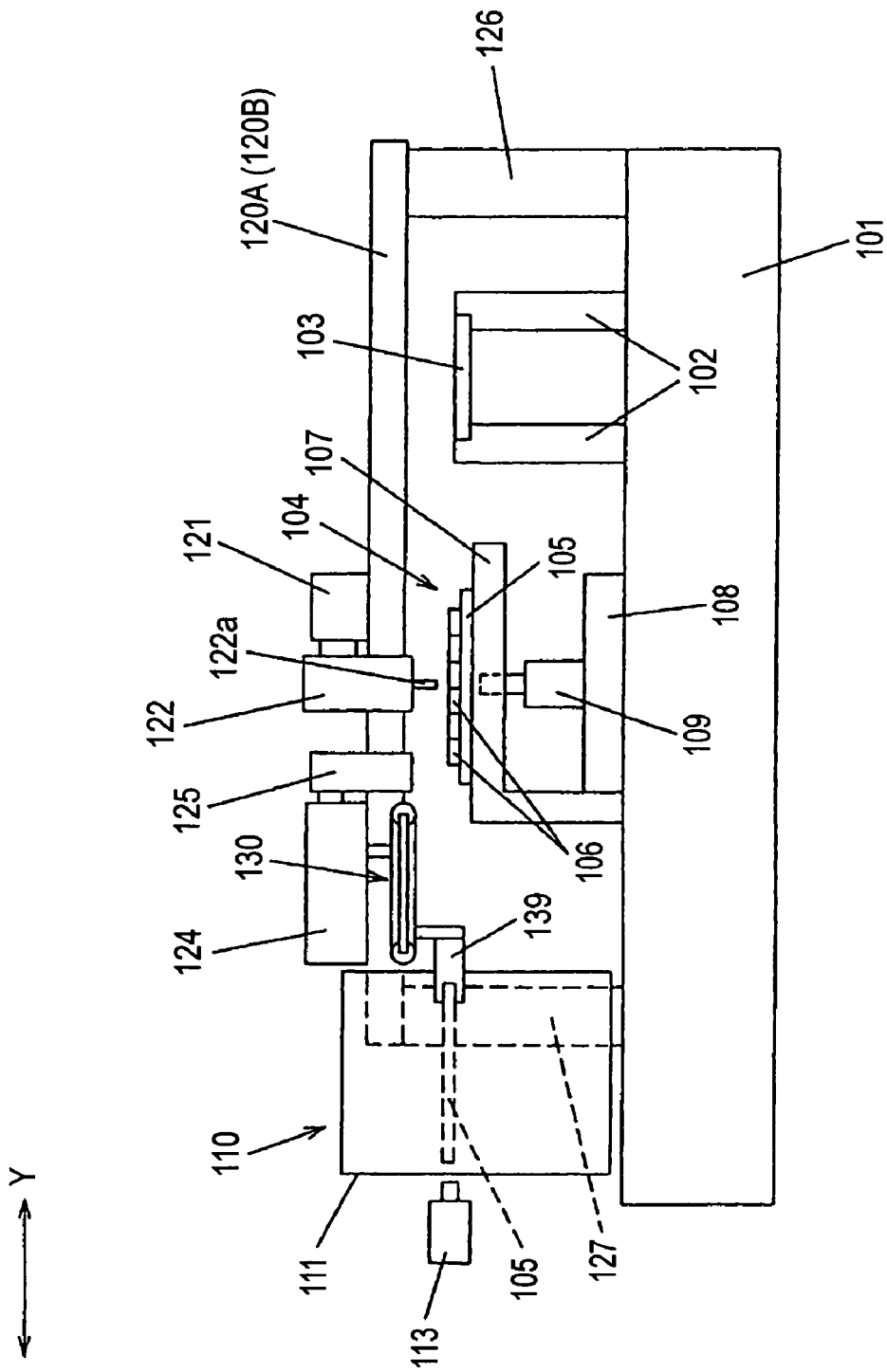
FIG. 8 is a side sectional view of the electronic component mounting apparatus according to other embodiment of the invention.

First, an explanation will be given of a total structure of an electronic component mounting apparatus in reference to FIG. 7 and FIG. 8. FIG. 8 shows a section taken along line A—A of FIG. 7. In FIG. 7, a board carrying path 102 is arranged above a base 101 in X direction. The board carrying path 102 carries a board 103 mounted with an electronic component to an electronic component mounting position to position to hold. Therefore, the board carrying path 102 constitutes a board holding portion arranged at a position remote from an electronic component supply portion 104 in Y direction (first direction).

As shown by FIG. 8, the electronic component supply portion 104 is provided with a jig holder 107 and the jig holder 107 is detachably mounted with a wafer ring 105 for holding a sheet pasted with a semiconductor chip 106 (hereinafter, abbreviated simply as "chip 106") which is an electronic component. The chips 106 are pasted thereto in a state of being separated into individual pieces thereof and in a state of mounting the wafer ring 105 on the jig holder 107, the electronic component supply portion 104 aligns a plurality of pieces of the chips 106 in a planar shape to supply. The wafer ring 105 constitutes a component holding jig.

As shown by FIG. 8, on a lower side of the wafer ring 105 held by the jig holder 107, an ejector 109 is arranged to be able to move horizontally by an ejector XY table 108. The ejector 109 is provided with a pin lifting mechanism for lifting an ejector pin (not illustrated) for pushing up a chip, and when the chip 106 is picked up from the sheet by a mounting head, mentioned later, by pushing up the chip 106 from below the sheet by the ejector pin, the chip 106 is exfoliated from the sheet. Further, as a mechanism of exfoliating the sheet from the chip 106, other than the method of using the ejector pin, there may be constituted a mechanism of sucking the sheet from the lower side to exfoliate the chip from the sheet by a suction force.

A wafer supply portion 110 is arranged at a position remote from the electronic component supply portion 104 on an upper face of the base 101 on a side opposed to the board carrying path 102 in Y direction (first direction). The wafer supply portion 110 is provided with a magazine holding portion 111 for holding and lifting a magazine contained with the wafer rings 105 in a laminated state and a lifter mechanism 112 for lifting the magazine at inside of the magazine holding portion 111. By adopting such an arrangement of the wafer supply portion 110, even when a magazine contained with a number of large-sized wafers is mounted to the magazine holding portion 111, a handling apparatus of a carriage or the like mounted with the magazine can easily be made to access to the magazine holding portion 111 and operability can be promoted.

By lifting the magazine by the lifter mechanism 112, the wafer ring 105 can be disposed to a carrying level for interchanging the wafer ring 105 between the wafer supply portion 110 and the electronic component supply portion 104. The wafer ring 105 disposed at the carrying level is appropriately pushed by a pushing mechanism 113, grabbed by a jig grabbing portion 139 of a jig interchanging mechanism 130, mentioned later, and carried to the electronic component supply portion 104. Further, the empty wafer ring 105 after all the chips 106 have been taken out at the electronic component supply portion 104 is carried out from the electronic component supply portion 104 to the wafer supply portion 110 by the jig interchanging mechanism 130 to recover into the magazine.

In FIG. 7, both end portions of the upper face of the base 101 is arranged with a first Y axis table 120A and a second Y axis table 120B respectively provided with a first Y axis drive mechanism and a second Y axis drive mechanism to direct longitudinal direction thereof in Y direction (first direction) orthogonal to the board carrying direction (X direction). The first Y axis table 120A and the second Y axis table 120B are hung with a first X axis table 121 and a second X axis table 124 respectively provided with a first X axis drive mechanism and a second X axis drive mechanism, respective both end portions of which are supported slidably in Y direction. By respectively driving the first Y axis drive mechanism and the second Y axis drive mechanism, the first X axis table 121 and the second X axis table 124 are moved individually in Y direction.

The first X axis table 121 is mounted with a mounting head 122 and a board recognizing camera 123 integrally movably by the first X axis drive mechanism. The mounting head 122 is provided with a nozzle 122a for holding the chip 106 and is made to be movable in a state of sucking to hold the chip 106 at the nozzle 122a. By driving the first X axis drive mechanism and the first Y axis drive mechanism, the mounting head 122 and the board recognizing camera are horizontally moved in X direction and in Y direction.

The mounting head 122 picks up the chip 106 of the electronic component supply portion 104 to hold and mounts the held chip 106 at an electronic component mounting position of the board 103 held at the board carrying path 102. Therefore, the first Y axis table 120A, the first X axis table 121 and the mounting head 122 constitute a component mounting means for holding the electronic component picked up from the electronic component supply portion 104 and mounting the held electric component on the board 103 held by the board holding portion.

Further, a pick up mechanism for taking out the chip 106 from the electronic component supply portion 104 may be provided to receive the chip 106 from the pick up mechanism by the mounting head 122 to hold. Further, when the pick up mechanism is provided with a chip reversing mechanism, the chip reversing mechanism can also deal with flip chip mounting for mounting the chip on the board by reversing head and tail thereof, which is preferable.

The board recognizing camera 123 moved to above the board 103 makes an image of the board 103 and by processing to recognize a result of taking the image by a board recognizing means (not illustrated), the electronic component mounting position at the board 103 is recognized. In mounting the chip 106 by the mounting head 122, the chip 106 is positioned to the electronic component mounting position based on a result of the recognition.

A side face of the second X axis table 124 on a side of the electronic component supply portion 104 is mounted with a component recognizing camera 125 which is an operating head via a guide rail 127 and a slider 128 (refer to FIG. 9). By driving the second X axis drive mechanism and the second Y axis drive mechanism, the first recognizing camera 125 is moved horizontally in X direction and in Y direction, thereby, the first recognizing camera 125 can be moved above the electronic component supply portion 104 for taking an image of the chip 106 above the wafer ring and can be moved for escaping from the position above the electronic component supply portion 104. The component recognizing camera 125 takes an image of the chip 106 held by the wafer ring 105 in a state of approaching above the component supply portion 104. Further, by processing to recognize a result of taking the image by component recognition processing means (not illustrated), a position of the chip 106 constituting an object of being taken out is recognized. In taking out the chip 106 by the mounting head 122, the nozzle 122a is positioned to the chip 106 based on a result of recognition.

The second Y axis drive mechanism and the second X axis drive mechanism constitute an operating head moving mechanism, and the second X axis table 124 becomes a moving beam mounted with the operating head and moved in the first direction by the operating head moving mechanism. Further, although as moving beam, a moving beam of a cantilever type only one side of which is supported may be used, in order to stably move the wafer ring 105 in interchanging the wafer ring, it is preferable to use a moving beam of a so-to-speak both sides supporting type both end portions of which are respectively supported by the first Y axis table 120A and the second Y axis table 120B as in the second X axis table 124 shown in the embodiment.

Figure 9A:
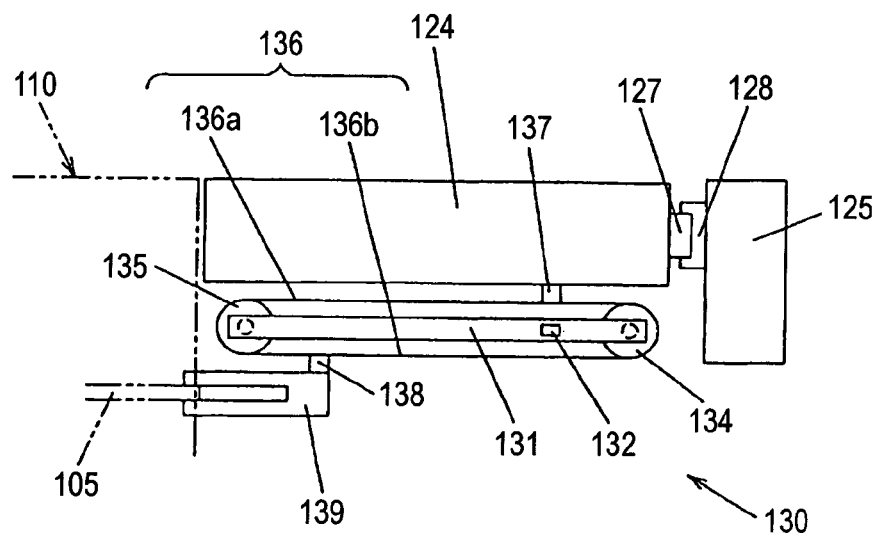
FIGS. 9A and 9B illustrate explanatory views of a structure of a jig interchanging mechanism of the electronic component mounting part according to other embodiment of the invention.

The jig interchanging mechanism 130 is arranged at a lower face of the second X axis table 124. The jig interchanging mechanism 130 interchanges the wafer ring 105 of the component supply portion 104 by grabbing the wafer ring 105 to move in Y direction between the component supply portion 104 and the wafer supply portion 110. A structure of the jig interchanging mechanism 130 will be explained in reference to FIGS. 9A and 9B. In FIG. 9A, the lower face of the second X axis table 124 is mounted with the jig grabbing portion 139 having a chuck claw for grabbing the wafer ring 105 horizontally movably in Y direction. The jig grabbing portion 139 is moved forward and rearward in Y direction relative to the second X axis table 124 by forward and rearward moving means explained below.

Figure 9B:
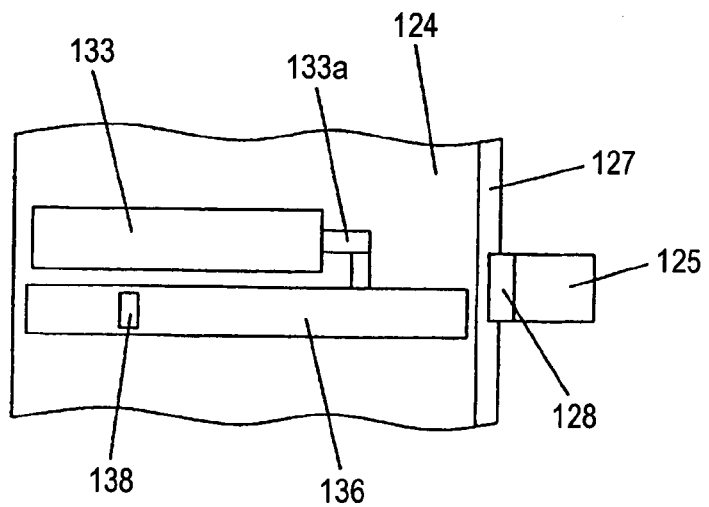

The lower face of the second X axis table 124 is arranged with a horizontal moving portion 131 to be able to reciprocate horizontally in Y direction relative to the X axis table 124. As shown by FIG. 9B, the horizontal moving portion 131 is connected to a rod 133a of a cylinder 133 via a coupling member 132. By driving the cylinder 133, the horizontal moving portion 131 is horizontally reciprocated relative to the second X axis table 124.

Both end portions of the horizontal moving portion 131 are respectively arranged with a first pulley 134 and a second pulley 135, and at the first pulley 134 and the second pulley 135, a belt 136 which is an endless flexing member is made to wrap thereon by opposing a belt upper portion 136a and a belt lower portion 136b respectively in a horizontal attitude. When the belt 136 is turned around the first pulley 134 and the second pulley 135 to move, the belt upper portion 136a and the belt lower portion 136b are run in directions reverse to each other by being respectively opposed to each other.

That is, the belt 136 is movably mounted to the horizontal moving portion 131 in a mode of forming a pair of parallel running portions (belt upper portion 136a, belt lower portion 136b) The belt upper portion 136a and the belt lower portion 136b are respectively connected to fix to the second X axis table 124 and the jig grabbing portion 139 via a first connecting portion 137 and a second connecting portion 138. Therefore, by driving the cylinder 133 the jig grabbing portion 139 is moved forward and rearward relative to the second X axis table 124.

Next, an explanation will be given of operation of interchanging the wafer by the jig interchanging mechanism 130 in reference to FIG. 9 and FIG. 10. The wafer interchanging operation is executed at a timing constituting out of a part at the wafer ring 105 of the electronic component supply portion 104 in a procedure of repeatedly executing a step of moving the second X axis table 124 to bring the component recognizing camera 125 to the electronic component supply portion 104 with an object of recognizing a part in taking out the part and a step of escaping the component recognizing camera 125 after finishing to take the image by the component recognizing camera 125 from the position above the electronic component supply portion 104 in operation of mounting the electronic component.

FIGS. 9A and 9B show operation in taking out the wafer ring 105 from the wafer supply portion 110 by the jig grabbing portion 139. That is, in a state of retracting the rod 133a of the cylinder 133, the second X axis table 124 is made to be close to the wafer supply portion 110 and a new one of the wafer ring 105 is grabbed by a chuck claw of the jig grabbing portion 139. When grabbing of the wafer ring 105 has been finished, the second X axis table 124 is moved in Y direction to the component supply portion 104.

Figure 10A:
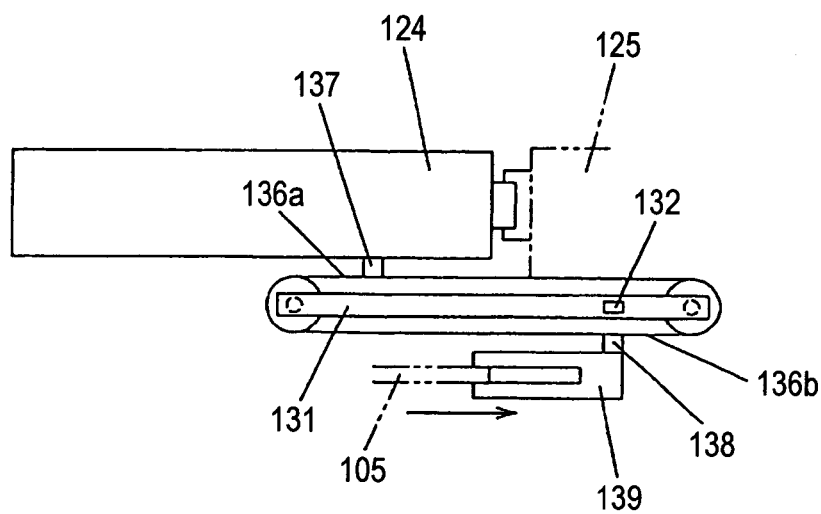
FIGS. 10A and 10B illustrate explanatory views of operation of the jig interchanging mechanism of the electronic component mounting apparatus according to other embodiment of the invention.
Figure 10B:
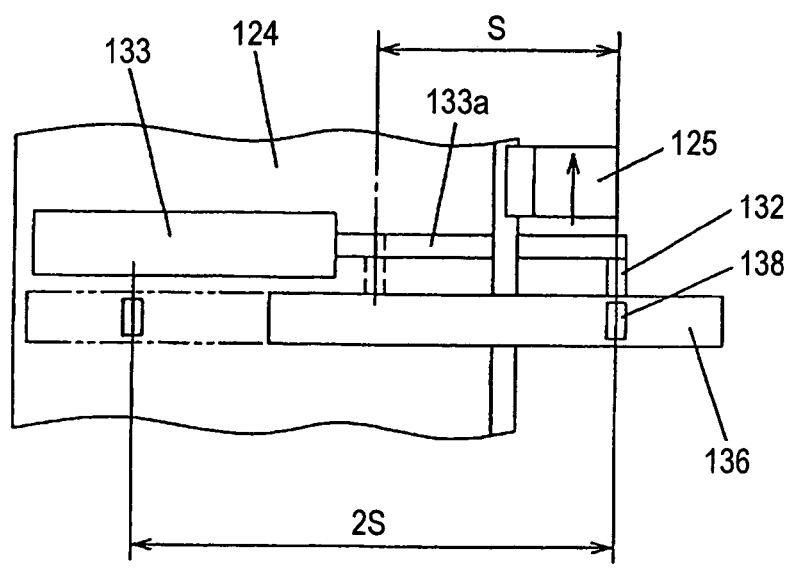

Further, simultaneously with movement of the second X axis table 124, as shown by FIGS. 10A and 10B, the electronic component mounting apparatus executes operation of bring the jig grabbing portion 139 grabbing the wafer ring 105 in a direction from the second X axis table 124 to the electronic component supply portion 104. That is, after escaping the component recognizing camera 125 in X axis direction to avoid interference between the component recognizing camera 125 and the horizontal moving portion 131, by extracting the rod 133a of the cylinder 133, the horizontal moving portion 131 is made to advance by an exerting stroke S of the rod 133a.

At this occasion, the horizontal moving portion 131 is made to advance in a state of connecting the belt upper portion 136a to fix to the second X axis table 124 via the first connecting portion 137 and therefore, the jig grabbing portion 139 connected to fix to the belt lower portion 136b via the second connecting portion 138 is made to advance from the second X axis table 124 by a stroke of 2S twice as much as the extracting stroke S of the rod 133a. Further, by moving the second X axis table 124 and the jig grabbing portion 139, the wafer ring 105 grabbed by the jig grabbing portion 139 is moved to the electronic component supply portion 104 to be mounted to the jig holder 107. Further, prior to the above-described operation, there is executed wafer ring recovering operation for recovering the wafer ring 105 brought into an empty state by taking out all the chips 106 at the electronic component supply portion 104 to the wafer supply portion 110. The wafer ring recovering operation is executed by an order reverse to that of the above-described operation.

That is, an electronic component mounting method accompanied by the above-described wafer ring interchanging operation is brought into a mode of moving the jig grabbing portion 139 forward and rearward in Y direction relative to the second X axis table 124 by the forward and rearward moving means provided at the wafer ring interchanging mechanism 130 in a procedure including an operating head approaching step of moving the second X axis table 124 which is the moving beam for bringing the component recognizing camera 125 which is the operating head to the electronic component supply portion 104 and an operating head escaping step of moving the moving beam for escaping the operating head from the position above the electronic component supply portion 104 after finishing operation by the operating head and repeatedly executing the operating head approaching step and the operating head escaping step.

Further, in the wafer ring interchanging operation by the second X axis table 124 and the jig interchanging mechanism 130, operation of moving the second X axis table 124 in Y direction and operation of moving forward and rearward the jig grabbing portion 139 relative to the second X axis table 124 are overlapped and therefore, the moving stroke in Y direction necessary for the second X axis table 124 can be reduced by an amount of moving the jig grabbing portion 139 forward and rearward.

Thereby, even in the case of adopting an apparatus layout arranged with the wafer supply portion 110 in series in Y direction in consideration of operability in attaching and detaching the magazine containing the wafer ring 105, compact formation of the apparatus is realized by making the length of the electronic component mounting apparatus in Y direction as short as possible. Further, by adopting the above-described constitution as forward and rearward moving means of the jig grabbing portion 139, the jig grabbing portion 139 can be moved forward and rearward by twice as much as the stroke by the cylinder 133 and a size in Y direction of the jig interchanging mechanism 130 can be shortened.

Further, although the above-described embodiment shows a constitution example in which the mounting head 122 is mounted to the first X axis table 121 and the component recognizing camera 125 as the operating head is mounted to the second X axis table 124 as the moving beam, the mounting head 122 may be the operating head and the jig interchanging mechanism 130 may be provided to the first X axis table 121 as the moving beam.

Further, constituent elements disclosed in the above-described embodiments 1, 2 can be arbitrarily combined respectively within the range not deviated from the gist of the invention.

The electronic component mounting apparatus and the electronic component mounting method of the invention achieve an effect of being capable of realizing the compact electronic component mounting apparatus and the electronic component mounting method excellent in the operational efficiency, and are applicable to a field of mounting the electronic component constituting the object by the electronic component supplied in the state of the semiconductor wafer of the semiconductor chip or the like.

The electronic component mounting apparatus of the invention achieves an effect of being capable of realizing the wafer ring interchanging mechanism by a compact constitution by ensuring the stroke of moving the jig grabbing portion without increasing the stroke of moving the moving beam and is useful for the electronic component mounting apparatus for taking out the electronic component from the component holding jig of the wafer ring or the like to mount to the board.

What is claimed is:

1. An electronic component mounting apparatus comprising:

an electronic component supply portion for supplying a plurality of pieces of electronic components aligned in a planer shape to be held by a component holding jig;

a board holding portion arranged at a position remote from the electronic component supply portion in a first direction;

a mounting head for holding the electronic component picked up from the electronic component supply portion and mounting the held electronic component on a board held by the board holding portion;

a mounting head moving mechanism for moving the mounting head between the electronic component supply portion and the board holding portion;

a component image taking camera for taking an image of the electronic component of the electronic component supply portion;

a component recognition processing portion for acquiring a position of the electronic component of the electronic component supply portion by processing the image taken by the component image taken camera;

a moving member for holding the component image taking camera and moving above the electronic component supply portion in the first direction driven by a component image taking camera moving mechanism; and a jig interchanging mechanism mounted to the moving member for interchanging the component holding jig of the electronic component supply portion by grabbing the component holding jig and moving in the first direction.

2. The electronic component mounting apparatus according to claim 1, wherein the moving member is a beam each of whose sides is supported.

3. The electronic component mounting apparatus according to claim 1, wherein the jig interchanging mechanism includes a jig grabbing portion mounted to the moving member movably in the first direction for grabbing the component holding jig, and a forward and rearward moving means for moving the jig grabbing portion forward and rearward in the first direction relative to the moving member.

4. The electronic component mounting apparatus according to claim 1, wherein the forward and rearward moving means includes a horizontal moving portion reciprocating in the first direction relative to the moving member driven by horizontal direction driving means, an endless flexing member movablly mounted to the horizontal moving portion in a mode of forming a pair of parallelly running portion running oppposedly to each other and in directions reverse to each other, and a first connecting portion and a second connecting portion for respectively connecting one side and the other side of the parallelly running portions to fix to the moving member and the jig grabbing portion.

5. An electronic component mounting apparatus comprising:

an electronic component supply portion for supplying a plurality of pieces of electronic components aligned in a planar shape to be held by a component holding jig;

a board holding portion arranged at a position remote from the electronic component supply portion in a first direction;

a component mounting means for holding the electronic component picked up from the electronic component supply portion and mounting the held electronic component on a board held by the board holding portion;

a moving member mounted with an operating head for moving in the first direction driven by an operating head moving mechanism; and a jig interchanging mechanism mounted to the moving member for interchanging the component holding jig of the electronic component supply portion by grabbing the component holding jig and moving in the first direction;

wherein the jig interchanging mechanism includes a jig grabbing portion mounted to the moving means movably in the first direction for grabbing the component holding jig, and a forward and rearward moving means for moving the jig grabbing portion forward and rearward in the first direction relative to the moving member.

6. The electronic component mounting apparatus according to claim 5, wherein the forward and rearward moving means includes:

a horizontal moving portion reciprocating in the first direction relative to the moving member driven by horizontal direction driving means;

an endless flexing member movably mounted to the horizontal moving portion in a mode of forming a pair of parallelly running portions running opposedly to each other and in directions reverse to each other; and a first connecting portion and a second connecting portion for respectively connecting one side and the other side of the parallelly running portions to fix to the moving member and the jig grabbing portion.

7. The electronic component mounting apparatus according to claim 5, wherein the operating head is a component image taking camera for taking an image of the electronic component of the electronic component supply portion.

8. The electronic component mounting apparatus according to claim 6, wherein the operating head is a component image taking camera for taking an image of the electronic component of the electronic component supply portion.

9. An electronic component mounting method conducted by an electronic component mounting apparatus including: an electronic component supply portion for supplying a plurality of pieces of electronic components aligned in a planar shape to be held by a component holding jig; a board holding portion arranged at a position remote from the electronic component supply portion in a first direction; a mounting head for holding the electronic component picked up from the electronic component supply portion and mounting the held electronic component on a board held by the board holding portion; a mounting head moving mechanism for moving the mounting head between the electronic component supply portion and the board holding portion; a component image taking camera for taking an image of the electronic component of the electronic component supply portion; a component recognition processing portion for acquiring a position of the electronic component of the electronic component supply portion by processing the image taken by the component image taking camera; a moving member for holding the component image taking camera and moving in the first direction above the electronic component supply portion driven by a component image taking camera moving mechanism; and a jig interchanging mechanism mounted to the moving member for interchanging the component holding jig of the electronic component supply portion by grabbing the component holding jig and moving in the fist direction, said electronic component mounting method comprising:

a camera escaping step of moving the component image taking camera to the electronic component supply portion by the image taking camera moving mechanism and taking the image of the electronic component and thereafter escaping the component image taking camera from a position above the electronic component supply portion;
a component recognizing step of acquiring positions of the plurality of electronic components by processing the image taken by the component image taking camera by the component recognition processing portion;
a component taking out step of successively picking up the plurality of electronic components by the mounting head while a positioning operation for successively positioning the mounting head to the plurality of electronic components is being executed by the mounting head moving mechanism based on the positions of the plurality of electronic components calculated by the component recognition processing portion;
a component mounting step of successively mounting the electronic component held by the mounting head on the board held by the board holding portion while moving the mounting head by the mounting head moving mechanism; and
a camera approaching step of bringing the component image taking camera again to the position above the electronic component supply portion in mounting the electronic component and successively taking the image of the plurality of electronic components;
wherein the component holding jig is carried out from the electronic component supply portion by the jig interchanging mechanism in a procedure of repeatedly executing the camera escaping step and the component holding jig is carried in to the electronic component supply portion by the jig interchanging mechanism in a procedure of repeatedly executing the camera approaching step.

10. The electronic component mounting method according to claim 9, wherein the moving member is a beam each of whose sides is supported.

11. An electronic component mounting method conducted by an electronic component mounting apparatus including: an electronic component supply portion for supplying a plurality of pieces of electronic components aligned in a planer shape to be held by a component holding jig; a board holding portion arranged at a position remote from the electronic component supply portion in a first direction; a component mounting means for holding the electronic component picked up from the electronic component supply portion and mounting the held electronic component on a board held by the board holding portion; a moving member mounted with an operating head for moving in the first direction driven by an operating head moving mechanism; and a jig interchanging mechanism mounted to the moving member for interchanging the component holding jig of the electronic component supply portion by grabbing the component holding jig and moving in the first direction; wherein the jig interchanging mechanism includes a jig grabbing portion mounted to the moving member movably in the first direction for grabbing the component holding jig, and a forward and rearward moving means for moving the jig grabbing portion forward and rearward in the first direction relative to the moving member;

said electronic component mounting method comprising:
an operating head approaching step for moving the moving member for bringing the operating head to the electronic component supply portion; and
an operating head escaping step of moving the moving member for escaping the operating head from a position above the electronic component supply portion after finishing an operation by the operating head,
wherein the jig grabbing portion is moved forward and rearward in the first direction relative to the moving member by a forward and rearward moving means provided at the jig interchanging mechanism in a procedure of repeatedly executing the operating head approaching step and the operating head escaping step.

12. The electronic component mounting method according to claim 11, wherein the operating head is a component image taking camera for taking an image of the electronic component of the electronic component supply portion, and an image of the electronic component of the electronic component supply portion is taken by the component image taking camera successive to the operating head approaching step.

* * * * *